(12) United States Patent
Cho et al.

(10) Patent No.: US 11,348,623 B2
(45) Date of Patent: May 31, 2022

(54) MEMORY DEVICE, CONTROLLER CONTROLLING THE SAME, MEMORY SYSTEM INCLUDING THE SAME, AND OPERATING METHOD THEREOF

(71) Applicant: Samsung Electronics Co., Ltd., Suwon-si (KR)

(72) Inventors: Hyunyoon Cho, Uiwang-si (KR); Sukhee Cho, Suwon-si (KR); Younghoon Son, Yongin-si (KR); Youngdon Choi, Seoul (KR); Junghwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/229,055

(22) Filed: Apr. 13, 2021

(65) Prior Publication Data
US 2022/0059144 A1 Feb. 24, 2022

(30) Foreign Application Priority Data
Aug. 21, 2020 (KR) .................. 10-2020-0105217

(51) Int. Cl.
*G11C 7/10* (2006.01)
*G11C 7/14* (2006.01)
(52) U.S. Cl.
CPC ............ *G11C 7/1072* (2013.01); *G11C 7/109* (2013.01); *G11C 7/1045* (2013.01); *G11C 7/1063* (2013.01); *G11C 7/14* (2013.01)

(58) Field of Classification Search
CPC ... G11C 7/1072; G11C 7/1045; G11C 7/1063; G11C 7/109; G11C 7/14
See application file for complete search history.

(56) References Cited

U.S. PATENT DOCUMENTS

| | | | |
|---|---|---|---|
| 6,259,729 | B1 | 7/2001 | Seki |
| 7,814,359 | B2 | 10/2010 | Bae et al. |
| 8,879,618 | B2 | 11/2014 | Abdalla et al. |
| 9,699,009 | B1 * | 7/2017 | Ainspan .................. H04L 7/033 |
| 9,705,531 | B2 | 7/2017 | Chan et al. |
| 10,312,896 | B2 | 6/2019 | Kim et al. |
| 2003/0093713 | A1 | 5/2003 | Werner et al. |
| 2005/0089126 | A1 | 4/2005 | Zerbe et al. |
| 2014/0169429 | A1 | 6/2014 | Ran |
| 2015/0256363 | A1 | 9/2015 | Shvydun et al. |

(Continued)

OTHER PUBLICATIONS

Extended European Search Report dated Dec. 14, 2021 issued in corresponding European Appln. No. 21179520.8.

(Continued)

*Primary Examiner* — Han Yang
(74) *Attorney, Agent, or Firm* — Harness, Dickey & Pierce, P.L.C.

(57) ABSTRACT

A method of operating a memory device includes receiving a training request for a data channel, detecting at least one mode parameter according to the training request, transmitting the detected mode parameter to an external device, setting at least one of an NRZ mode and a PAM4 mode to a transmission signaling mode based on mode register set setting information from the external device, and performing communications with the external device according to the set transmission signaling mode.

20 Claims, 16 Drawing Sheets

(56) References Cited

U.S. PATENT DOCUMENTS

2015/0378950 A1* 12/2015 Cox .................. G06F 13/4068
710/14
2019/0103143 A1    4/2019  Hasbun et al.
2020/0125505 A1    4/2020  Brox et al.

OTHER PUBLICATIONS

Min, K. and T. Oh. "0.5-4.4 Gbit/s PAM4/NRZ dual-mode transceiver with 0.6 V near-ground NMOS driver for low-power memory interface." Electronics Letters vol. 54, No. 11 (2018): pp. 684-685.

* cited by examiner

MEMORY DEVICE, CONTROLLER CONTROLLING THE SAME, MEMORY SYSTEM INCLUDING THE SAME, AND OPERATING METHOD THEREOF

CROSS-REFERENCE TO RELATED APPLICATION(S)

This application claims benefit of priority to Korean Patent Application No. 10-2020-0105217 filed on Aug. 21, 2020 in the Korean Intellectual Property Office, the disclosure of which is incorporated herein by reference in its entirety.

BACKGROUND

The present disclosure relates to a memory device, a controller controlling the same, a memory system including the same, and a method of operating the same.

In general, the demand for higher-capacity data transmission at higher speed is growing with extensive deployment of mobile devices and a rapid increase in Internet traffic. However, it may be difficult for a signal modulation scheme based on non-return-to-zero (NRZ) type encoding to satisfy such growing demand for higher-capacity data transmission at higher speed. In recent years, a pulse amplitude modulation (for example, pulse amplitude modulation 4-level (PAM4)) signaling scheme has been actively developed as an alternative to a signal scheme for higher-capacity data transmission at higher speed.

SUMMARY

Example embodiments provide a memory device selecting a transmission signaling mode, a controller controlling the same, a memory system including the same, and a method of operating the same.

According to example embodiments, a memory device includes memory device processing circuitry configured to transmit read data to a data channel according to a transmission signaling mode, receive write data from the data channel according to the transmission signaling mode, store the transmission signaling mode, and perform a training operation on the data channel in response to a training request received from an external device, to detect at least one mode parameter in the training operation, to select one of a first transmission signaling mode and a second transmission signaling mode as the transmission signaling mode using the detected mode parameter, and to output mode flag information, associated with the detected mode parameter, to the external device.

According to example embodiments, a method of operating a memory device includes receiving a training request for a data channel, detecting at least one mode parameter according to the training request, transmitting the detected mode parameter to an external device, setting at least one of a non-return-to-zero (NRZ) mode and a pulse amplitude modulation 4-level (PAM4) mode to a transmission signaling mode based on mode register set setting information from the external device, and performing communications with the external device according to the set transmission signaling mode.

According to example embodiments, a memory system includes a memory device, configured to receive or transmit data through a data channel, according to a transmission signaling mode selected from a first transmission signaling mode and a second transmission signaling mode, and a controller configured to control the memory device and to select the transmission signaling mode using at least one mode parameter. The memory device includes memory device processing circuitry configured to store the transmission signaling mode, and to receive a training request from the controller, to detect at least one mode parameter, associated with the data channel, in response to the training request, and to transmit flag information, associated with the detected at least mode parameter, to the controller.

According to example embodiments, a controller controlling a memory device includes a controller processing circuitry configured to generate a clock and to output the clock to the memory device, generate a command address signal to operate the memory device, transmit the command address signal in response to the clock, and transmit data to and receive data from the memory device through a data channel according to a transmission signaling mode selected from a first transmission signaling mode and a second transmission signaling mode. Flag information, associated with at least one mode parameter, is received from the memory device during a training period of the memory device, and one of the first transmission signaling mode and the second transmission signaling mode is determined to be the transmission signaling mode using the flag information.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

In a memory system according to example embodiments, a transmission signaling mode may be selected based on channel environment information in a memory device and improved or optimal data transmission may be performed in the selected transmission signaling mode.

Figure 1:
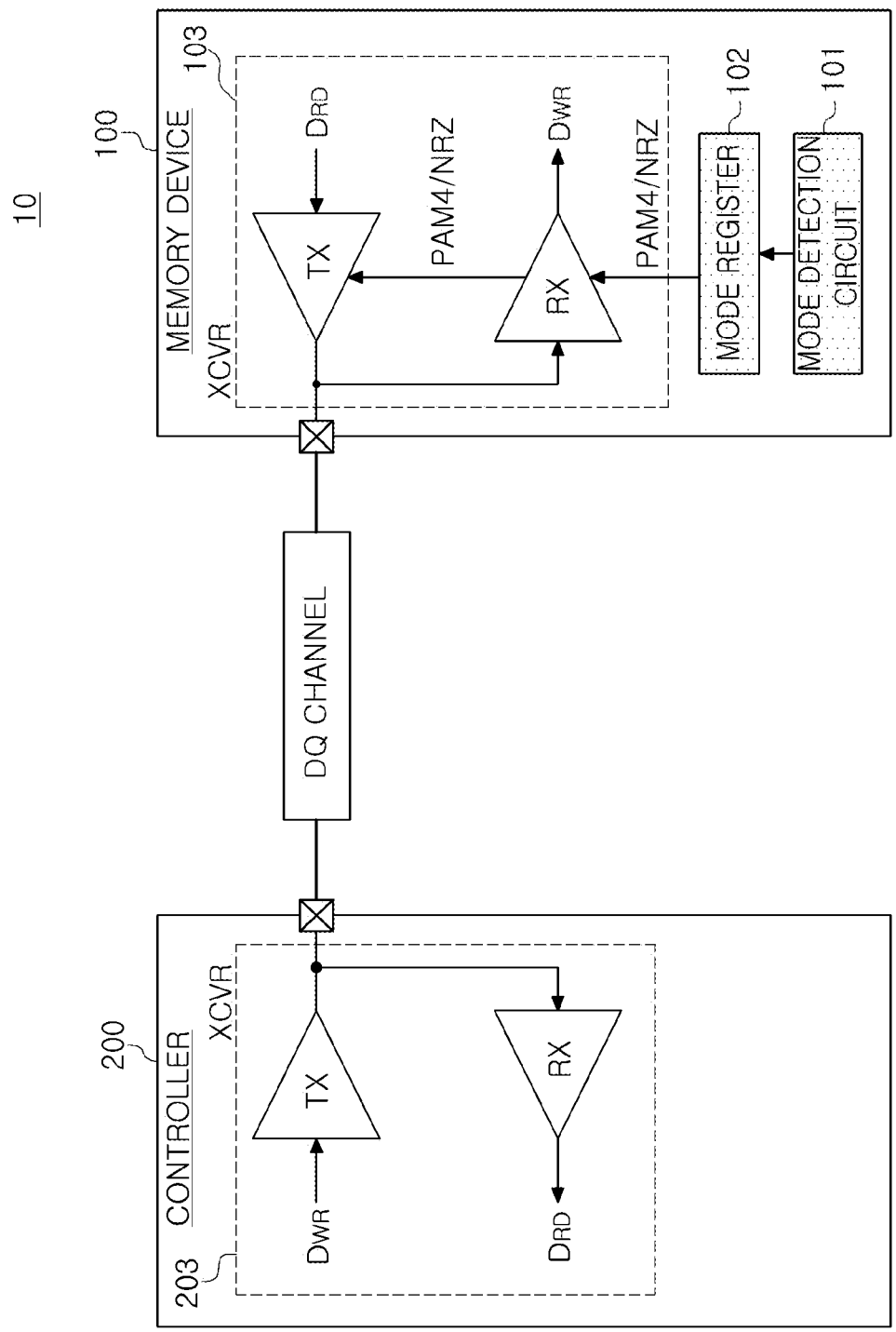
FIG. 1 is a view illustrating a memory system according to example embodiments.

FIG. 1 is a view illustrating a memory system 10 according to example embodiments. Referring to FIG. 1, the memory system 10 may include a memory device 100 and/or a controller 200. The memory system 10 may be implemented as a multi-chip package (MCP) or a system-on-chip (SoC).

The memory device 100 may be configured to store data received from the controller 200 or to output read data to the controller 200. The memory device 100 may be used as an operation memory, a working memory, or a buffer memory in a computing system. In example embodiments, the memory device 100 may be implemented as a single in-line memory module (SIMM), a dual in-line memory module (DIMM), a small-outline DIMM (SODIMM), an unbuffered DIMM (UDIMM), a fully-buffered DIM (FBDIMM), a rank-buffered DIMM (RBDIMM), a mini-DIMM, a micro-DIMM, a registered DIMM (RDIMM), or a load-reduced DIMM (LRDIMM).

In example embodiments, the memory device 100 may be implemented as a volatile memory. For example, the volatile memory may include at least one of is dram a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a Rambus DRAM (RDRAM), and a static RAM (SRAM). In example embodiments, the memory device 100 may be implemented as a nonvolatile memory. For example, the nonvolatile memory may include one of a NAND flash memory, a phase-change RAM (PRAM), a magneto-resistive RAM (MRAM), a resistive RAM (ReRAM), a ferro-electric RAM (FRAM), and a NOR flash memory.

Although not illustrated in the drawing, the memory device 100 may include a serial presence detect (SPD) chip. The SPD chip may be configured to store information on characteristics of the memory device 100. In example embodiments, the SPD chip may store memory device information such as a module type, an operating environment, a line arrangement, a module configuration, and storage capacity of the memory device 100. In example embodiments, the SPD chip may include a programmable read-only memory, for example, an electrically erasable programmable read-only memory (EEPROM).

In addition, the memory device 100 may include a mode detection circuit 101, a mode register 102, and/or a dual-mode transceiver (XCVR) 103.

The mode detection circuit 101 may be configured to detect an improved or optimal transmission signaling mode, based on environment information of a data channel. The transmission signaling mode may include different multi-level signaling modes. For example, the transmission signaling mode may include non-return-to-zero (NRZ), pulse amplitude modulation 4-level (PAM4), and the like. For example, the mode detection circuit 101 may select an NRZ mode or a PAM4 mode according to channel loss, current consumption, or a termination voltage.

The mode register 102 may be configured to store the transmission signaling mode selected by the mode detection circuit 101.

The transceiver (XCVR) 103 may be configured to transmit and receive data through a data channel (DQ channel), according to the transmission signaling mode stored in the mode register 102. In example embodiments, the transceiver 103 may be implemented as a dual-mode transceiver. Hereinafter, for ease of description, the transceiver 103 will be referred to as a dual-mode transceiver.

The dual-mode transceiver 103 may include a transmitter TX and a receiver RX. The transmitter TX of the memory device 100 may be configured to transmit read data DRD to the controller 200 through the data channel, according to a transmission signaling mode PAM4/NRZ. The receiver RX of the memory device 100 may be configured to receive write data DWR from the controller 200 through the data channel, according to the transmission signaling mode PAM4/NRZ.

The controller 200 may be configured to control the memory device 100. The controller 200 may indicate the transmission signaling mode stored in the memory device 100. The controller 200 may transmit data to and receive data from the memory device 100 through the data channel, according to the transmission signaling mode.

The controller 200 may include a transceiver 203. The transceiver 203 may include a transmitter TX and a receiver RX. The transmitter TX of the controller 200 may be configured to transmit write data DWR to the memory device 100 through the data channel, according to the transmission signaling mode PAM4/NRZ. The receiver RX of the controller 200 may be configured to receive the read data DRD from the memory device 100 through the data channel, according to the transmission signaling mode PAM4/NRZ.

In example embodiments, the controller 200 may be configured as an additional chip or may be integrated with the memory device 100. For example, the controller 200 may be implemented on a mainboard. In addition, the controller 200 may be implemented as an integrated memory controller (IMC) included in a microprocessor. In addition, the controller 200 may be disposed in an input/output hub. The input/output hub, including the controller 200, may be referred to as a memory controller hub (MCH).

In general, data transmission using a PAM4 signal may be advantageous to reduce a channel loss effect as a bandwidth of an interface of a memory device is increased.

The memory system 10 according to example embodiments may have an interface including a transceiver XCVR, capable of providing an NRZ/PAM4 dual-mode operation, to perform an improved or optimal transmission operation according to a channel environment.

In addition, the memory system 10 according to example embodiments may include the memory device 100, varying an improved or optimal transmission signaling mode NRZ/PAM4 according to a channel environment, to automatically select a mode.

Figure 2A:
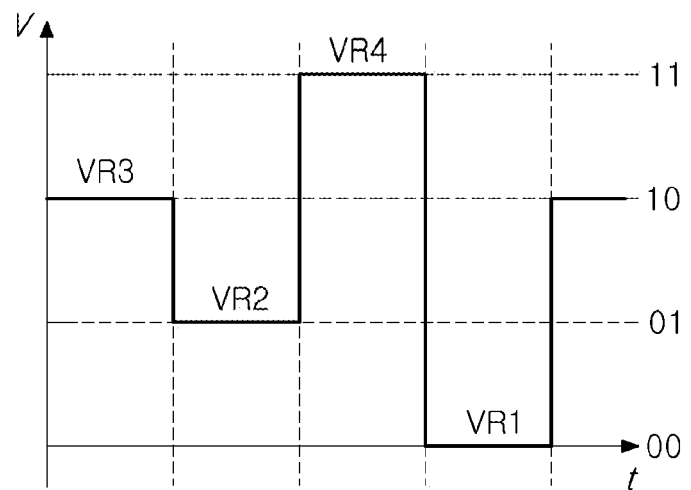
FIGS. 2A and 2B are views illustrating transmission signaling according to example embodiments.
Figure 2B:
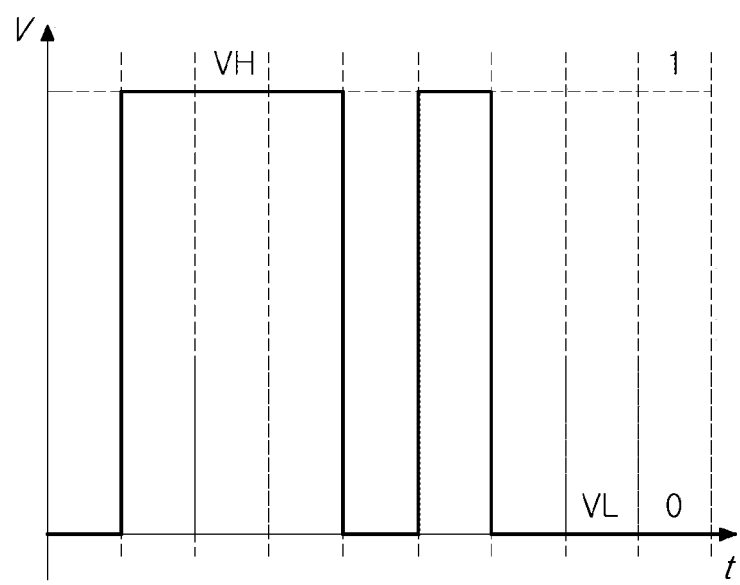

FIGS. 2A and 2B are views illustrating transmission signaling according to example embodiments. Referring to FIG. 2A, two bits of data '00', '01', '10', and '11' corresponding to four voltage levels VR1 to VR4 may be transmitted based on PAM4 transmission signaling. Referring to FIG. 2B, one bit of data '1' and '0' corresponding to two voltage levels VL and VH may be transmitted based on NRZ transmission signaling.

It will be understood that the data corresponding to the voltage levels, illustrated in FIGS. 2A and 2B, are only examples.

Figure 3:
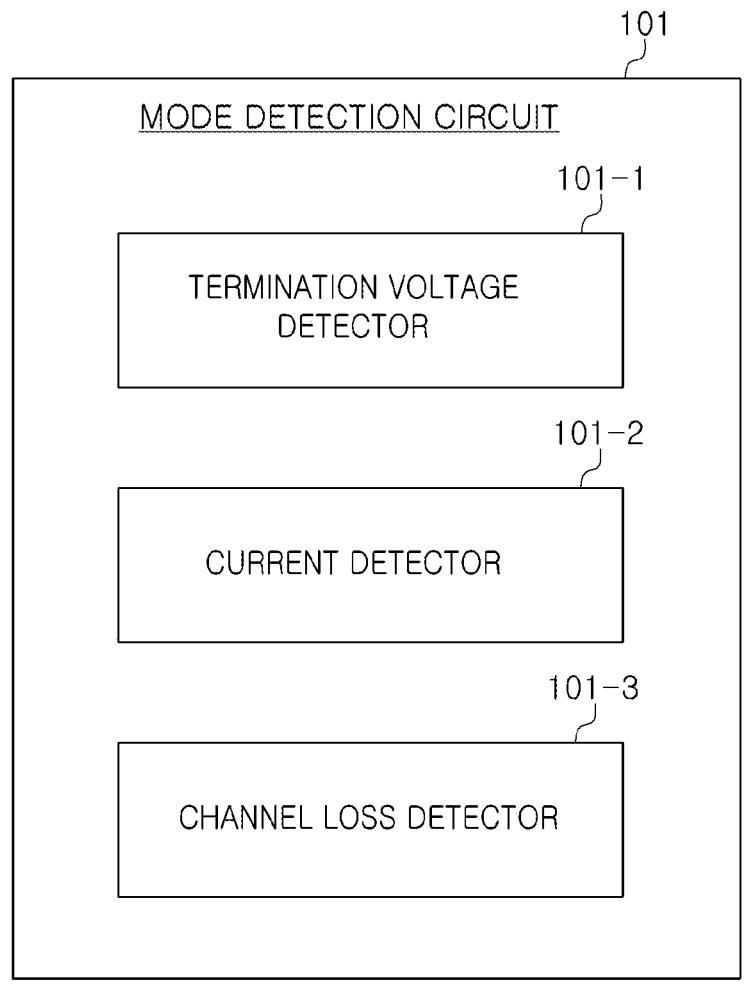
FIG. 3 is a view illustrating a mode detection circuit according to example embodiments.

FIG. 3 is a view illustrating a mode detection circuit 101 according to example embodiments. Referring to FIG. 3, the mode detection circuit 101 may include a termination voltage detector 101-1, a current detector 101-2, and/or a channel loss detector 101-3.

The termination voltage detector 101-1 may be configured to detect a termination voltage corresponding to a channel. In some example embodiments, the detected termination voltage may be used to select a transmission signaling mode. For example, when the termination voltage is higher than a reference voltage, a PAM4 mode may be selected. When the termination voltage is not higher than the reference voltage, an NRZ mode may be selected.

The current detector 101-2 may be configured to detect current consumed by the memory device 100. In some example embodiments, the detected consumed current may be used to select a transmission signaling mode. For example, when the consumed current is higher than reference current, the PAM4 mode may be selected. When the consumed current is not higher than the reference current, the NRZ mode can be selected. As described above, it will be understood that the selection of the PAM4 mode and the NRZ mode according to the consumed current is only an example. For example, when the consumed current is higher than the reference current, the NRZ mode may be selected. When the consumed current is not higher than the reference current, the PAM4 mode may be selected.

The channel loss detector 101-3 may be configured to detect loss of a data channel. In some example embodiments, the detected channel loss may be used to select a transmission signaling mode. For example, when the channel loss is greater than the reference value, the PAM4 mode may be selected. When the channel loss is not greater than the reference value, the NRZ mode may be selected.

The mode detection circuit 101 according to example embodiments may detect at least one of the termination voltages, the consumed current, and the channel loss to vary a transmission signaling mode corresponding to the data channel.

It will be understood that the mode detection circuit 101, illustrated in FIG. 3, is only an example. The mode detection circuit according to the present disclosure may be implemented as at least one of the termination voltage detector 101-1, the current detector 101-2, and the channel loss detector 101-3.

Figure 4:
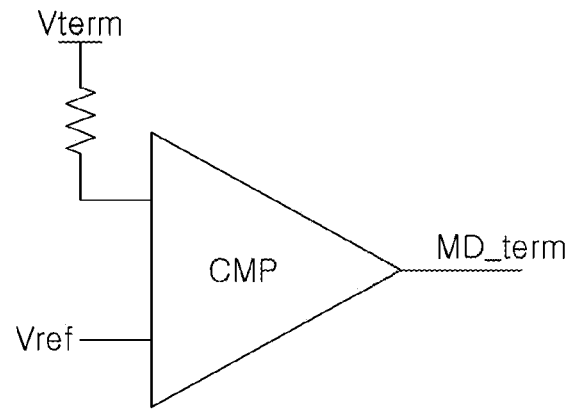
FIG. 4 is a view illustrating a termination voltage detector according to example embodiments.

FIG. 4 is a view illustrating a termination voltage detector 101-1 according to example embodiments. Referring to FIG. 4, the termination voltage detector 101-1 may include a comparator CMP. The comparator CMP may compare a termination voltage Vterm, corresponding to a data channel, with a reference voltage Vref and may output mode information MD_term to the mode register 102.

It will be understood that the termination voltage detector 101-1, illustrated in FIG. 4, is only an example.

Figure 5:
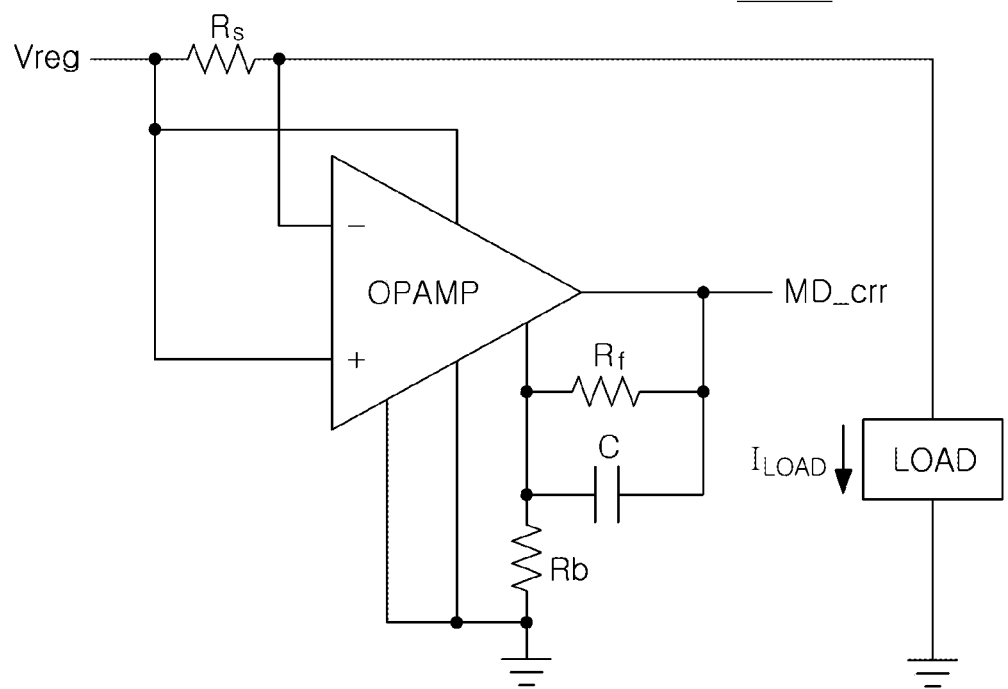
FIG. 5 is a view illustrating a current detector according to example embodiments.

FIG. 5 is a view illustrating a current detector 101-2 according to example embodiments. Referring to FIG. 5, the current detector 101-2 may include an amplifier OPAMP. The amplifier OPAMP may compare current, corresponding to power Vreg, with load current $I_{LOAD}$ and may output mode information MD_crr to the mode register 102.

It will be understood that the current detector 101-2, illustrated in FIG. 5, is only an example of the present disclosure.

The current detector 101-2, illustrated in FIG. 5, may be implemented inside the memory device 100. However, the present disclosure is not necessarily limited thereto. A current detector according to the present disclosure may be disposed outside or external to a memory device.

Figure 6:
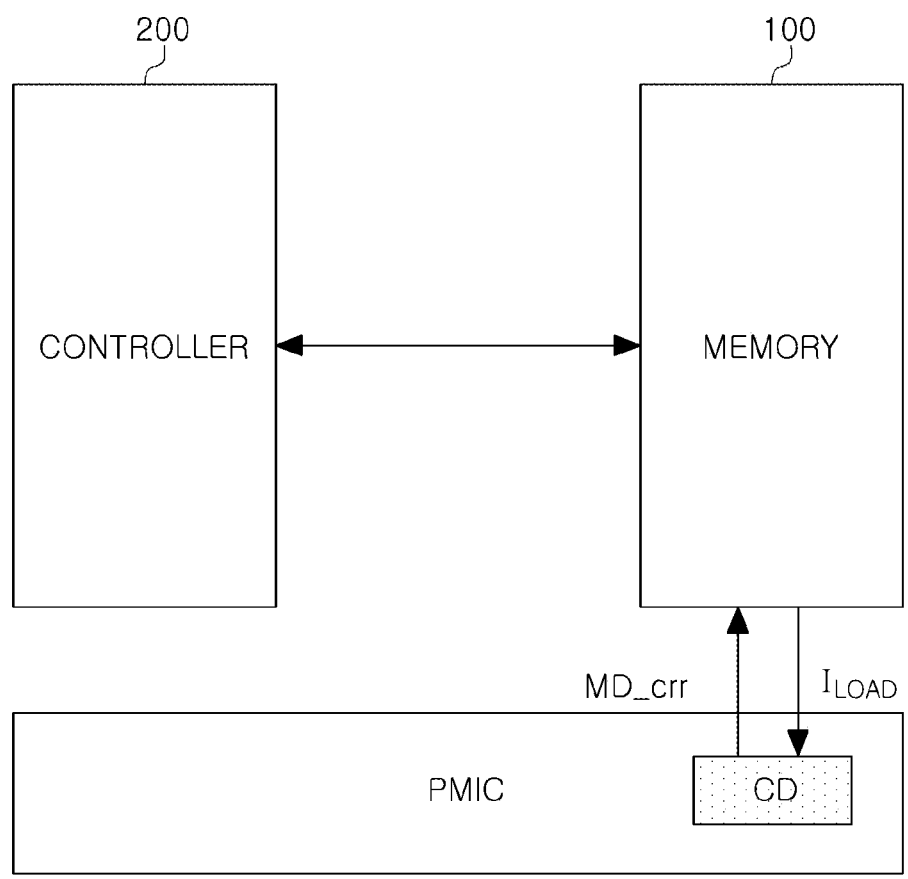
FIG. 6 is a view illustrating a current detector according to example embodiments.

FIG. 6 is a view illustrating a current detector CD according to example embodiments. Referring to FIG. 6, the current detector CD may be disposed inside a power management circuit PMIC. The current detector CD may sense the current $I_{LOAD}$ consumed by the memory device 100 and may transmit mode information MD_crr, corresponding to a detection result, to the memory device 100.

Figure 7:
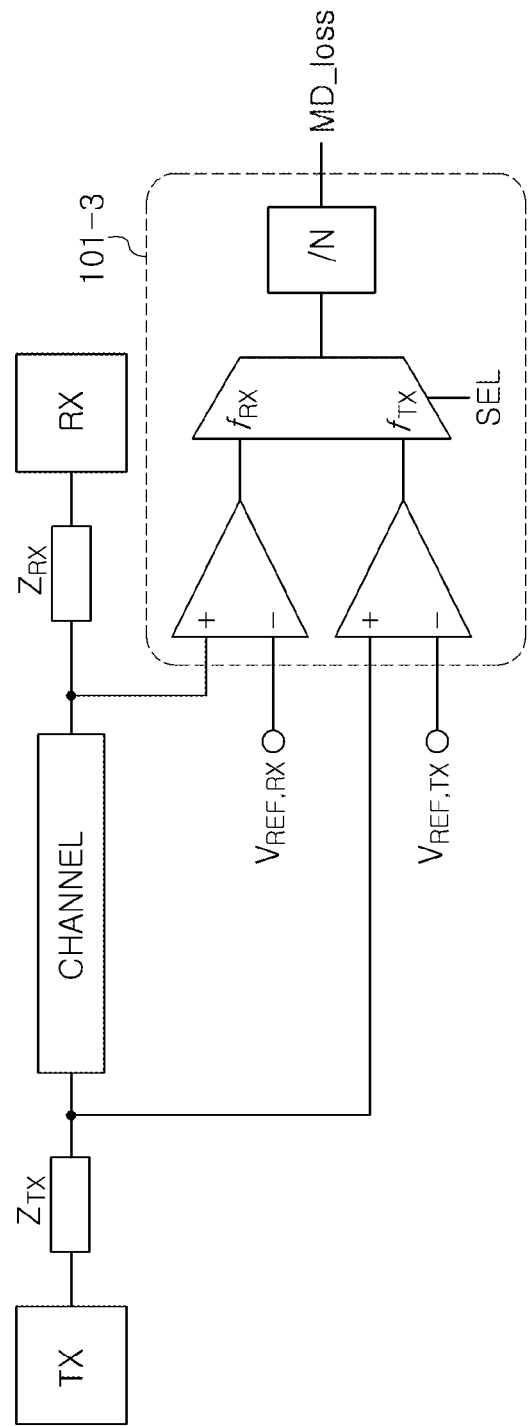
FIG. 7 is a view illustrating a channel loss detector according to example embodiments.

FIG. 7 is a view illustrating a channel loss detector 101-3 according to example embodiments. Referring to FIG. 7, the channel loss detector 101-3 may include comparators configured to compare comparison voltages $V_{REF,RX}$ and $V_{REF,TX}$ on a channel front end or a channel back end with each other, a multiplexer configured select one output, among outputs of the comparators, in response to a selected signal SEL, and a divider configured to divide an output of the multiplexer. Frequency information, output from the divider, may include mode information MD_loss and may be input to the mode register 102.

It will be understood that the channel loss detector 101-3, illustrated in FIG. 7, is only an example of the present disclosure. Voltages on the channel front end and the channel back end may be simply compared with each other to detect mode information MD_loss corresponding to channel loss.

Figure 8:
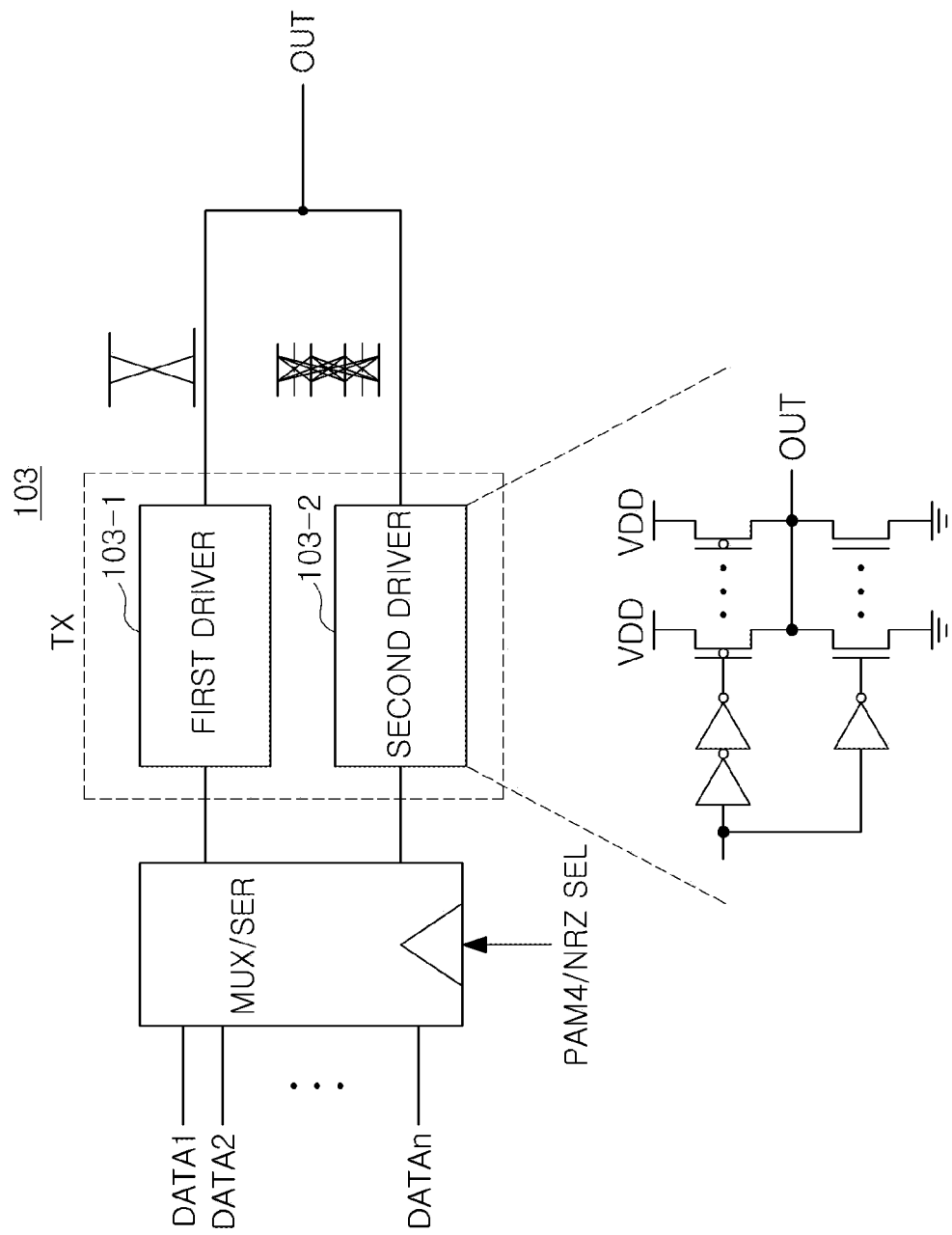
FIG. 8 is a view illustrating a dual-mode transceiver according to example embodiments.

FIG. 8 is a view illustrating a dual-mode transceiver 103 according to example embodiments. Referring to FIG. 8, a transmitter TX of the dual-mode transceiver 103 may include a serializer MUX/SER, a first driver 103-1, and/or a second driver 103-2.

The serializer MUX/SER may convert and output parallel data DATA1 to DATAn into serial data, according to a transmission signaling mode.

The first driver 103-1 may be activated in response to a first transmission signaling mode signal NRZ. The first driver 103-1 may transmit and receive a data signal, according to an NRZ signaling scheme.

The second driver 103-2 may be activated in response to a second transmission signaling mode signal PAM4. The second driver 103-2 may transmit and receive data signals, according to a PAM4 signaling scheme. In example embodiments, the second driver 103-2 may include a low swing driver LSD, configure to generate signals having low swing levels (VR2 and VR3 of FIG. 2A), and a high swing driver HSD configured to generate signals having high swing levels (VR1 and VR4 of FIG. 2A). The detailed description of the second driver 103-2 is disclosed in U.S. Pat. No. 10,312,896, the disclosure of which is incorporated herein by reference.

As illustrated in FIG. 8, each of the first driver 103-1 and the second driver 103-2 may include at least one pull-up driver between a power supply terminal VDD and an output terminal OUT and at least one pull-down driver between the output terminal OUT and a ground terminal.

Figure 9:
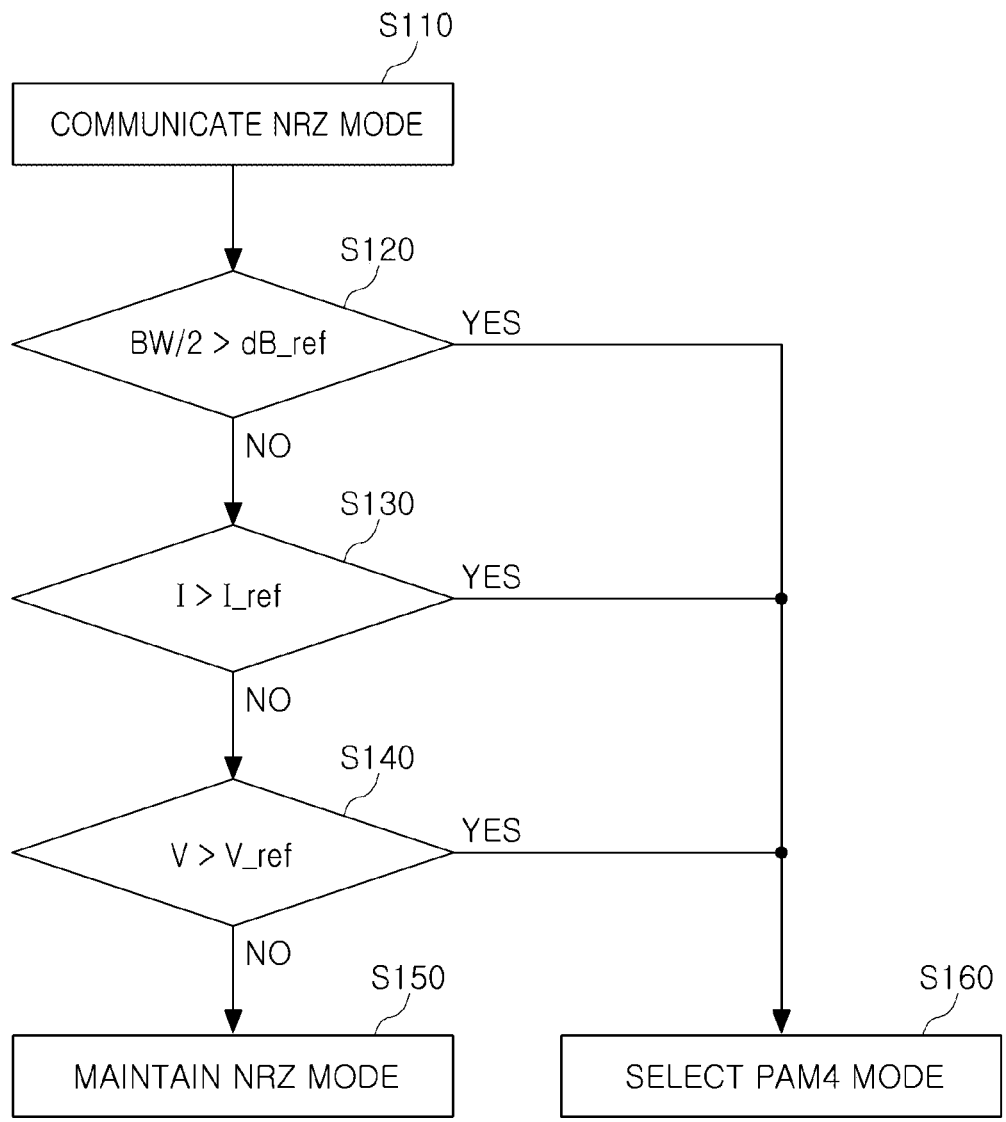
FIG. 9 is a flowchart illustrating a mode selection method of a memory device according to example embodiments.

FIG. 9 is a flowchart illustrating a mode selection method of a memory device 100 according to example embodiments. Hereinafter, the mode selection method of the memory device 100 will be described with reference to FIGS. 1 to 9.

The memory device 100 may basically communicate with the controller 200 in the NRZ mode (S110). A determination may be made as to whether a half value BW/2 of a bandwidth corresponding to a data channel is greater than a reference bandwidth dB_ref (S120). When the half value BW/2 of the bandwidth is not greater than the reference bandwidth dB_ref, a determination may be made as to whether consumed current I is higher than reference current I_ref (S130). When the consumed current I is not greater than the reference current I_ref, a determination may be made as to whether a termination voltage V is higher than a reference voltage V_ref (S140). When the termination voltage V is not higher than the reference voltage V_ref, the NRZ mode may be maintained (S150).

When the half value BW/2 of the bandwidth is greater than the reference bandwidth dB_ref, the consumed current I is higher than the reference current I_ref, or the termination voltage V is greater than the reference voltage V_ref, the PAM4 mode may be selected (S160).

It will be understood that a comparison criterion for the bandwidth, illustrated in FIG. 9 is not limited to the half value of BW/2 of the bandwidth.

Also, it will be understood that the operation order, illustrated in FIG. 9, is only an example of the present disclosure.

In the mode selection method described in FIG. 9, the NRZ mode is set to a default mode, but the present disclosure is not limited thereto. In the mode selection method according to the present disclosure, a PAM4 mode may be set to a default mode.

Figure 10:
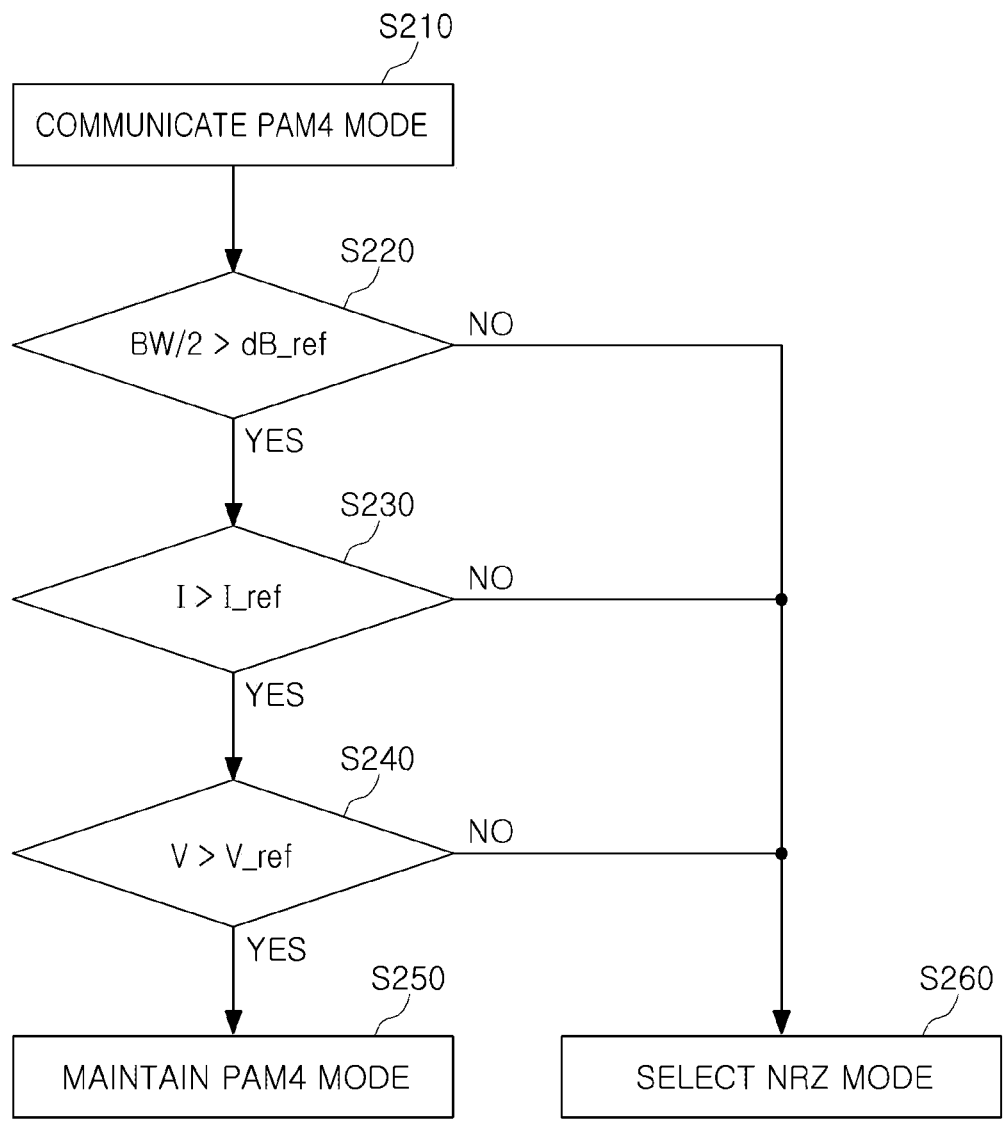
FIG. 10 a flowchart illustrating a mode selection method of a memory device according to example embodiments.

FIG. 10 a flowchart illustrating a mode selection method of a memory device 100 according to example embodiments. Hereinafter, the mode selection method of the memory device 100 will be described with reference to FIGS. 1 to 10.

The memory device 100 may basically communicate with the controller 200 in the PAM4 mode (S210). A determination may be made as to whether a half value BW/2 of a bandwidth corresponding to a data channel is greater than a reference bandwidth dB_ref (S220). When the half value BW/2 of the bandwidth is greater than the reference bandwidth dB_ref, a determination may be made as to whether consumed current I is higher than reference current I_ref (S230). When the consumed current I is higher than the reference current I_ref, a determination may be made as to whether a termination voltage V is higher than a reference voltage V_ref (S240). When the termination voltage V is higher than the reference voltage V_ref, the PAM4 mode may be maintained (S250).

When the half value BW/2 of the bandwidth is not greater than the reference bandwidth dB_ref, the consumed current I is not higher than the reference current I_ref, or the termination voltage V is not greater than the reference voltage V_ref, the NRZ mode may be selected (S260).

In general, a training operation may be performed on a memory device in a startup or specific situation. The training may allow a controller to enhance reliability of data or signal exchange with the memory device. For example, training data may be written to or read from the memory device under various conditions to determine an improved or optimal clock timing or reference level. A mode selection operation of the memory device 100 according to the present disclosure may be performed during a training operation period.

Figure 11:
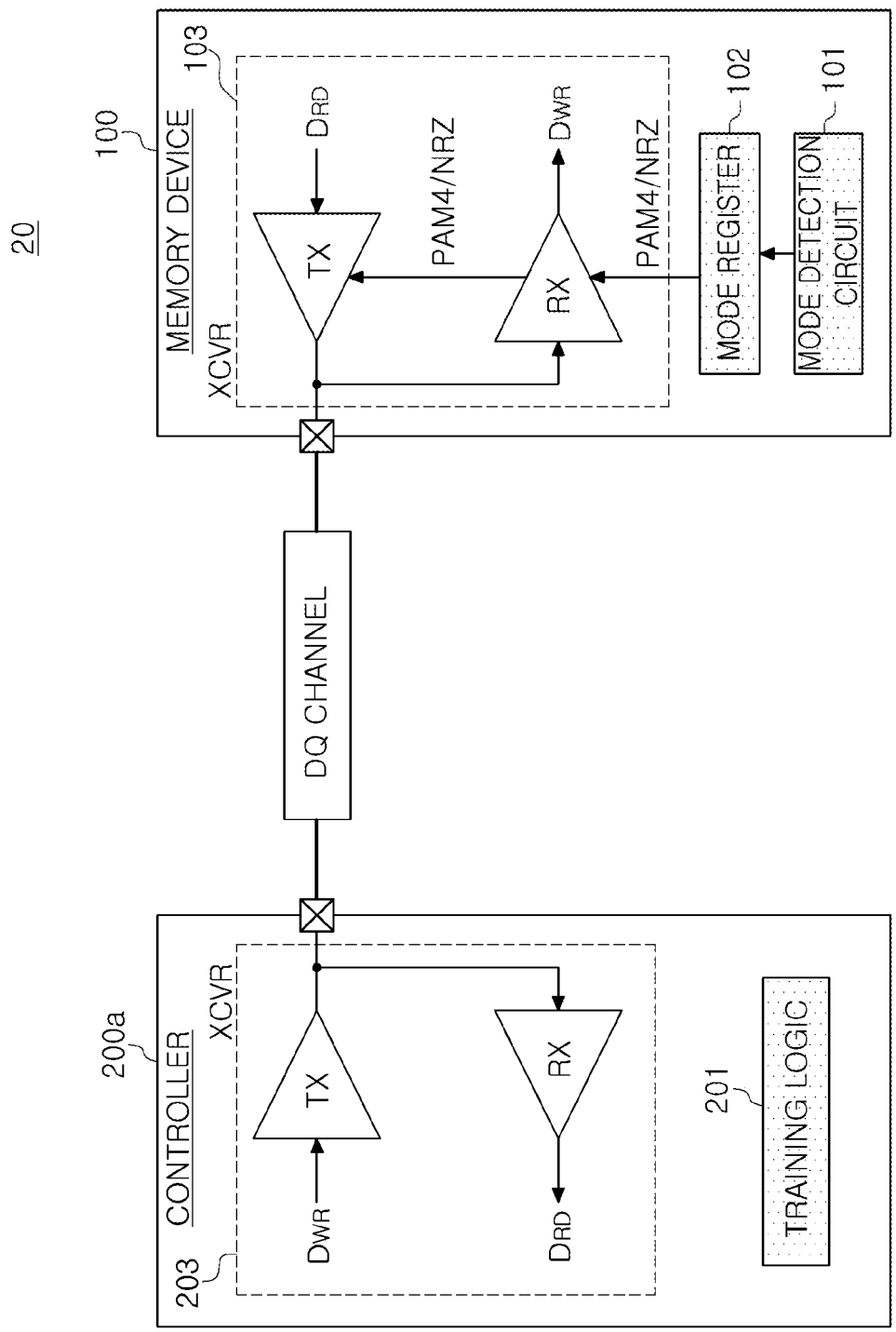
FIG. 11 is a view illustrating a memory system according to example embodiments.

FIG. 11 is a view illustrating a memory system 20 according to example embodiments. Referring to FIG. 11, as compared with the memory system 10 illustrated in FIG. 1, the memory system 20 may include a controller 200a including a training logic 201. The training logic 201 may perform a training operation on a data channel of a memory device 100 to communicate with the memory device 100, according to a predetermined or alternatively, desired scheme. According to such a training operation, the memory device 100 may detect and select a transmission signaling mode most appropriate to the data channel.

The transmission signaling mode may be selected by setting a mode register set (MRS) using a detected mode parameter according to example embodiments.

Figure 12A:
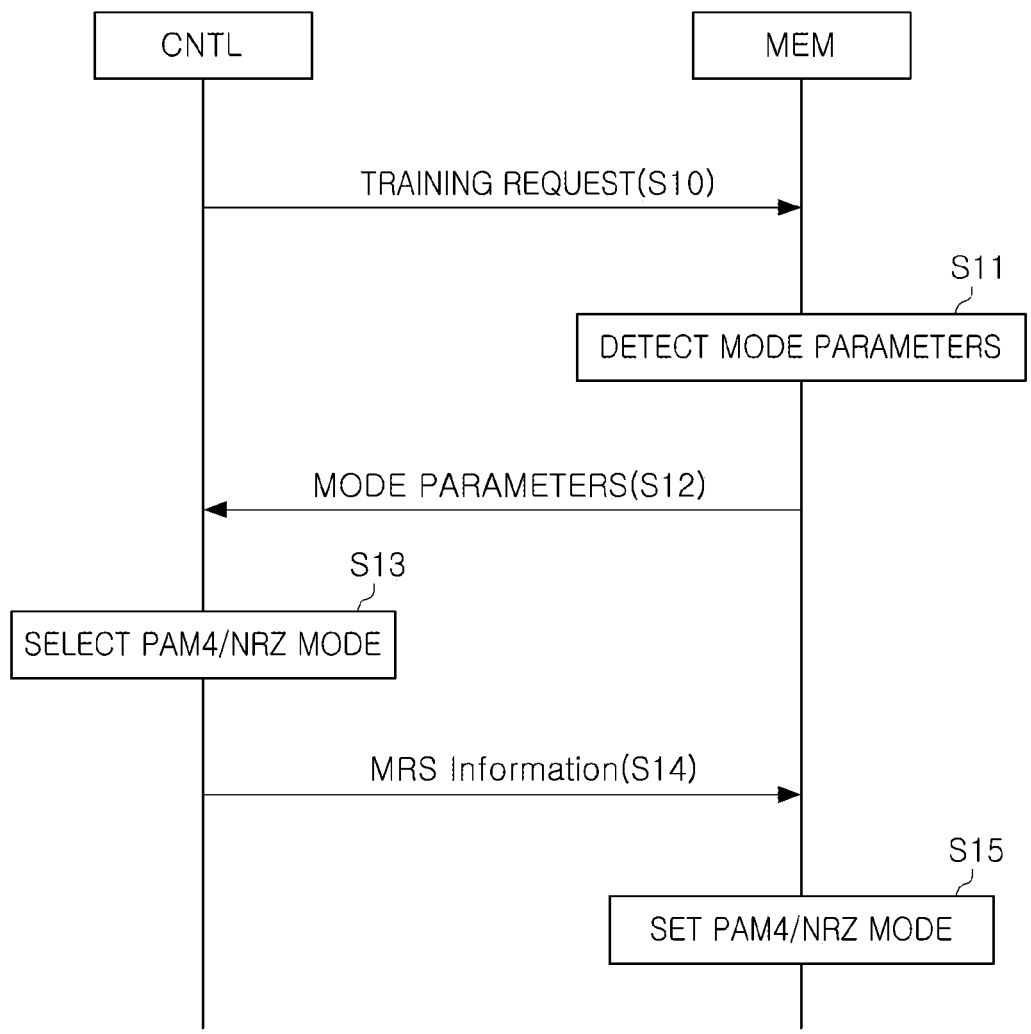
FIG. 12A is a ladder diagram illustrating a training operation of a memory system according to example embodiments.

FIG. 12A is a ladder diagram illustrating a training operation of a memory system according to example embodiments. Hereinafter, a training operation in a memory device MEM and a controller CNTL will be described with reference to FIGS. 1 to 11.

Before performing communication, the controller CNTL may transmit a training request (or a training command) to the memory device MEM (S10). The memory device MEM may perform a training operation, corresponding to a data channel, in response to the training request. In particular, the memory device MEM may detect at least one mode parameter to select a transmission signaling mode improved or optimal for the data channel (S11). The at least one mode parameter may include consumed current, a termination voltage, and channel loss associated with the data channel. The memory device MEM may transmit flag information, associated with the detected mode parameter, to the controller CNTL (S12). The controller CNTL may select a transmission signaling mode, based on the flag information (S13). The controller CNTL may transmit MRS information for setting the transmission signaling mode to the memory device MEM (S14). The memory device 100 may perform MRS setting associated with the transmission signaling mode PAM4/NRZ, based on the MRS information (S15).

In the memory system according to the present disclosure, transmission signaling mode setting is not necessarily limited to the MRS setting. The memory system according to the present disclosure may select a transmission signaling mode using a mode parameter detected by a memory device.

Figure 12B:
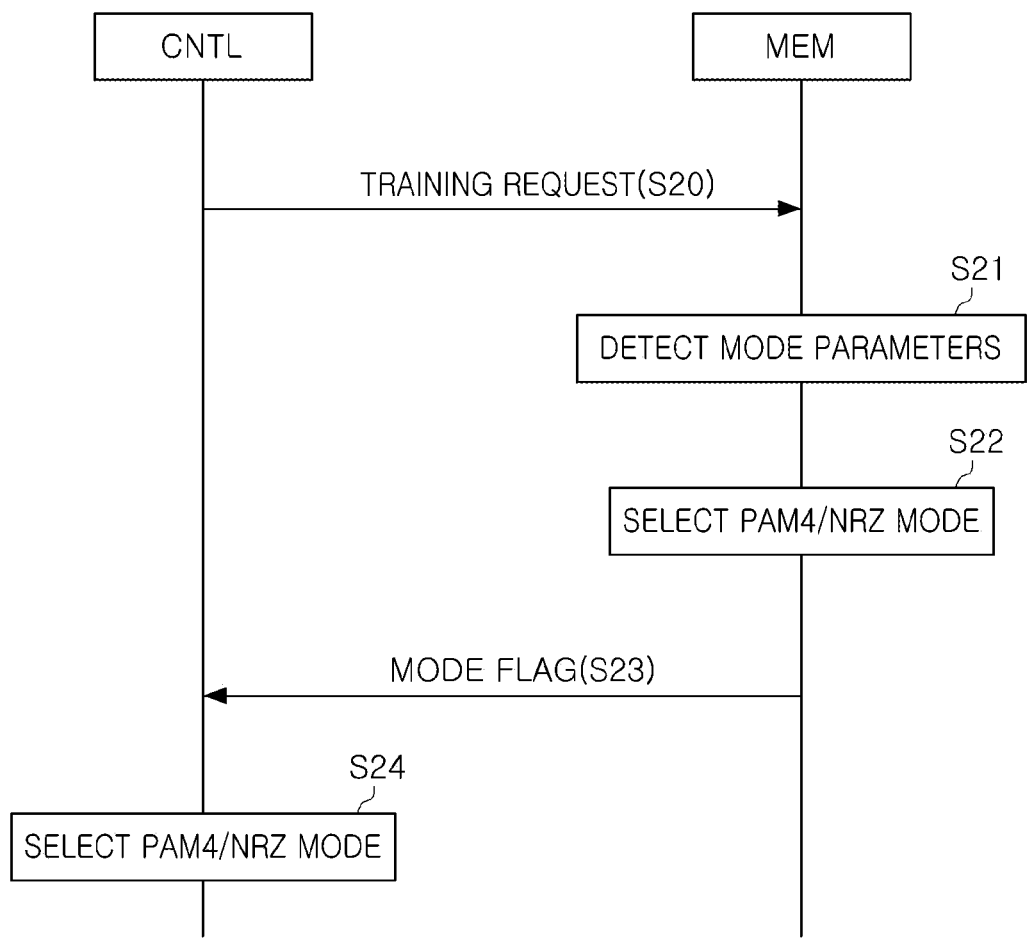
FIG. 12B is a ladder diagram illustrating a training operation of a memory system according to example embodiments.

FIG. 12B is a ladder diagram illustrating a training operation of a memory system according to example embodiments. Hereinafter, a training operation in a memory device MEM and a controller CNTL will be described with reference to FIGS. 1 to 11.

Before performing communication, the controller CNTL may transmit a training request (or a training command) to the memory device MEM (S20). The memory device MEM may perform a training operation, corresponding to a data channel, in response to the training request and may detect at least one mode parameter as a result of the training operation (S11). The memory device MEM may select a transmission signaling mode PAM4/NRZ using a detected mode parameter (S22). The memory device MEM may transmit mode flag information, corresponding to the selected transmission signaling mode PAM4/NRZ, to the controller CNTL (S23). The controller CNTL may select the transmission signaling mode PAM4/NRZ, based on the mode flag information (S24).

It will be understood that the methods of selecting a transmission signaling mode using a detected mode parameter, described in FIGS. 12A and 12B, are only examples of the present disclosure.

Figure 13:
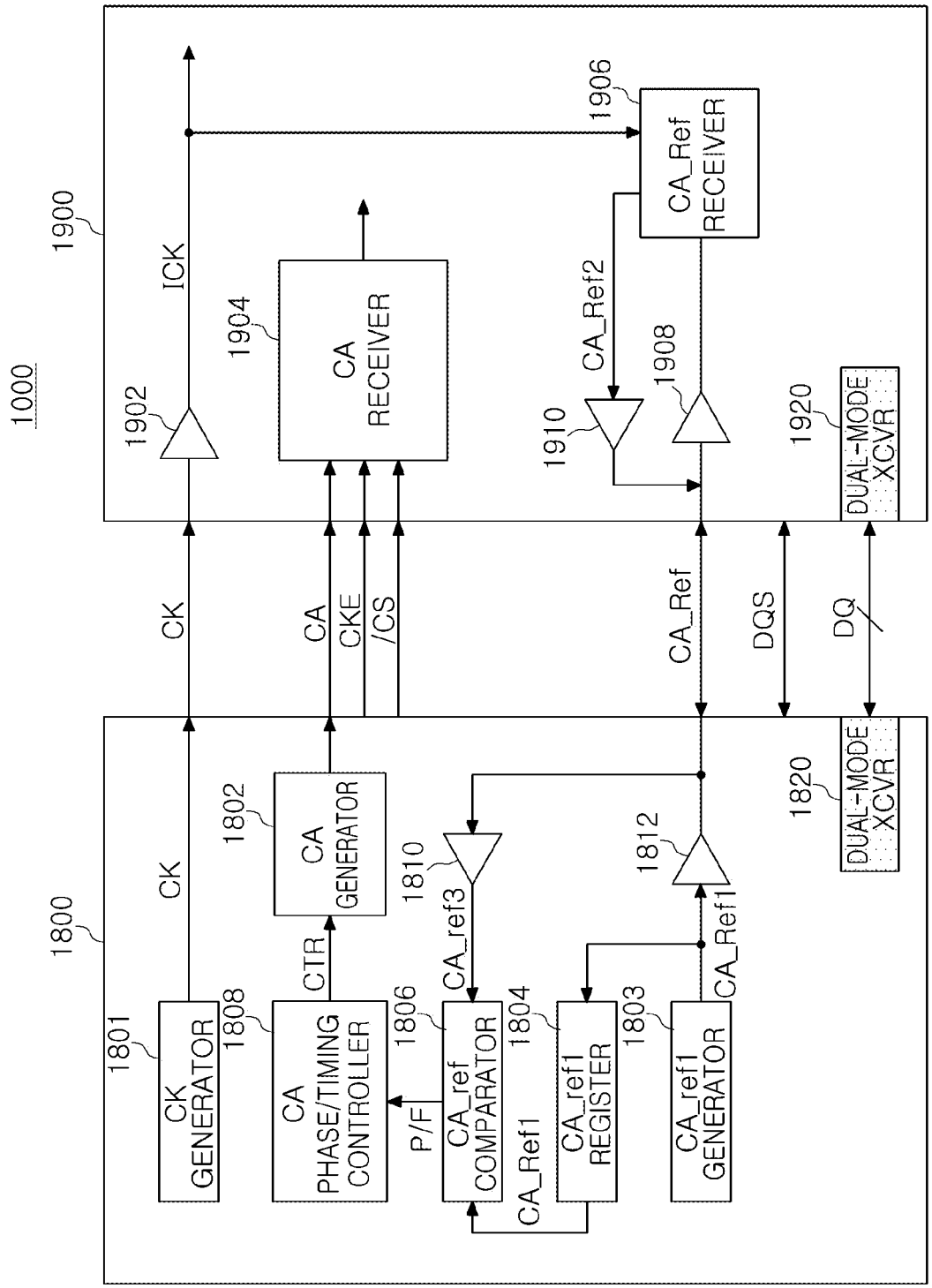
FIG. 13 is a view illustrating a memory system performing at least one command/address calibration according to example embodiments.

FIG. 13 is a view illustrating a memory system performing at least one command/address calibration according to example embodiments.

Referring to FIG. 13, a memory system 1000 may include a controller 1800 and/or a memory device 1900. The controller 1800 may include a clock generator 1801, a command/address (CA) generator 1802, a command/address reference generator 1803, a register 1804, a comparator 1806, a phase/timing controller 1808, and/or data input/output units 1810 and 1812. The controller 1800 may provide a clock signal CK, generated by the clock generator 1801, to the memory device 1900 through a clock signal line.

In example embodiments, the memory system 1000 may have an additional command/address reference signal (CA_Ref) line provided in an interface. The command/address reference signal (CA_Ref) line may serve to transmit and receive a reference signal CA_Ref of a command/address, a reference value of a command/address, in a calibration mode.

A calibration result value using such a reference value of the command/address may be provided to the phase/timing controller 1808 to adjust phase/timing of the command/address signal CA. Since there is the additional command/address reference signal (CA_Ref) line, a calibration operation may be performed to adjust phase/timing of the command/address signal CA while performing an operation to transmit the command/address signal CA.

The CA generator 1802 may generate a phase or timing-adjusted command/address signal CA in response to a control signal CTR of the phase/timing controller 1808, and may transmit phase or timing-adjusted command/address signal CA to a memory device 1900.

The command/address reference generator 1803 may have the same configuration as the command/address generator 1802 and may generate a first command/address reference signal CA_Ref, identical to the command/address signal CA generated by the command/address generator 1802.

A first command/address reference signal CA_Ref1 may be provided to the register 1804. Also, the first command/address reference signal CA_Ref1 may be transmitted to a CA reference bus 16 through a data output unit 1812 and may be provided to the memory device 1900 through the CA reference bus 16.

The register 1804 may store the first command/address reference signal CA_Ref1. The comparator 1806 may compare the first command/address reference signal CA_Ref1, stored in the register 1804, with a third command/address reference signal CA_Ref3 output from the data input unit 1810. The comparator 1804 may compare data of the first command/address reference signal CA_Ref1 with data of the third command/address reference signal CA_Ref3 to generate a pass or fail signal P/F.

The phase/timing controller 1808 may generates a control signal CTR indicating a phase shift of the command/address signal CA according to the pass or fail signal P/F of the comparator 1806. The control signal CTR may adjust a phase or timing of the command/address signal CA to generate a phase-adjusted command/address signal CA.

The data input unit 1810 may receive a second command/address reference signal CA_Ref2, transmitted through a CA reference bus, from the memory device 1900 and may transmit the second command/address reference signal CA_Ref2 to the comparator 1806 as the third command/address reference signal CA_Ref3.

The data output unit 1812 may receive the first command/address reference signal CA_Ref1, generated by the command/address reference generator 1803, and transmit the first command/address reference signal CA_Ref1 to a CA reference bus 12.

The memory device 1900 may include a clock buffer 1902, a command/address (CA) receiver 1904, a command/address reference receiver 1906, and/or data input/output units 1908 and 910. The clock buffer 1902 may receive a clock signal CK, transmitted through a clock signal line, to generate an internal clock signal ICK. The CA receiver 1904 may receive a chip select signal/CS, a clock enable signal CKE, and a command/address signal CA, transmitted through a CA bus, in response to the internal clock signal ICK.

The clock enable signal CKE may be used as a pseudo command acting as a read command of the command/address signal CA transmitted through the CA bus. The CA receiver 1904 may receive the command/address signal CA when the clock enable signal CKE is activated.

The data input unit 1908 may receive the first command/address reference signal CA_Ref1, transmitted through the CA reference bus, from the controller 1800 and may transmit the first command/address reference signal CA_Ref1 to the command/address reference receiver 1906. The command/address reference receiver 1906 may have the same configuration as the CA receiver 1904. The command/address reference receiver 1906 may receive the chip select signal/CS, the clock enable signal CKE, and the first command/address reference signal CA_Ref1, transmitted through the CA reference bus, in response to an internal clock signal ICK to generate a second command/address reference signal CA_Ref2.

The second command/address reference signal CA_Ref2 may be the same as a signal output from the CA receiver 1904 by receiving the chip select signal/CS, the clock enable signal CKE, and the command/address signal CA, transmitted through the CA bus, in response to the internal clock signal ICK. The second command/address reference signal CA_Ref2 may be transmitted to the CA reference bus through the data output unit 1910.

Hereinafter, CA calibration performed in the memory system 1000 will be described. The CA generator 1802 of the controller 1800 may adjust a phase or timing of the command/address signal CA in response to a control signal CTR of the phase/timing controller 1808 to transmit the command/address signal CA to a CA bus. The command/address reference generator 1803 may generate a first command/address reference signal CA_Ref1, identical to the command/address signal CA, and may transmit the first command/address reference signal CA_Ref1 to a CA reference bus.

The CA reference receiver 1906 of the memory device 1900 may receive the first command/address reference signal CA_Ref1 according to the internal clock signal ICK and the clock enable signal CKE to generate a second command/address reference signal CA_Ref2. The second command/address reference signal CA_Ref2 of the memory device 1900 may be transmitted to the CA reference bus.

The controller 1800 may transmit the first command/address reference signal CA_Ref1, transmitted through the CA reference bus, to the comparator 1806 as the second command/address reference signal CA_Ref2. The comparator 1806 may compare data of the first command/address reference signal CA_Ref1 with data of the second command/address reference signal CA_Ref2 to generate a pass or fail signal P/E. The phase/timing controller 1808 may generate a control signal CTR, indicating a phase shift of the command/address signal CA, according to the pass or fail signal P/F of the comparator 1806. The CA generator 1802 may generate a phase-adjusted command/address signal CA according to the control signal CTR.

With the repetition of such a CA calibration operation, the phase/timing controller 1808 of the controller 1800 may determine the middle of locations passed (P) to be the middle of a command/address signal (CA) window, and may generate a command/address signal CA to bring the middle of the command/address signal (CA) window into an edge of the clock signal CK and provide the command/address signal CA to the memory device 1900. Accordingly, the memory device 1900 may receive a command/address signal CA in which the middle of an effective window is disposed on rising/falling edges of a pair of clock signals (a clock signal pair) CK and CKB on rising/falling edges of the clock signal CK.

The memory system 1000 according to example embodiments may include the dual-mode transceiver 1820 and 1920, described with reference to FIGS. 1 to 12B, respectively provided in the controller 1800 and the memory device 1900.

In example embodiments, each of the dual-mode transceivers 1820 and 1920 may select one of the NRZ and PAM4 modes through a plurality of data channels DQ in real time, and may transmit data to the selected mode.

A memory system according to example embodiments may be disposed on a single substrate.

Figure 14:
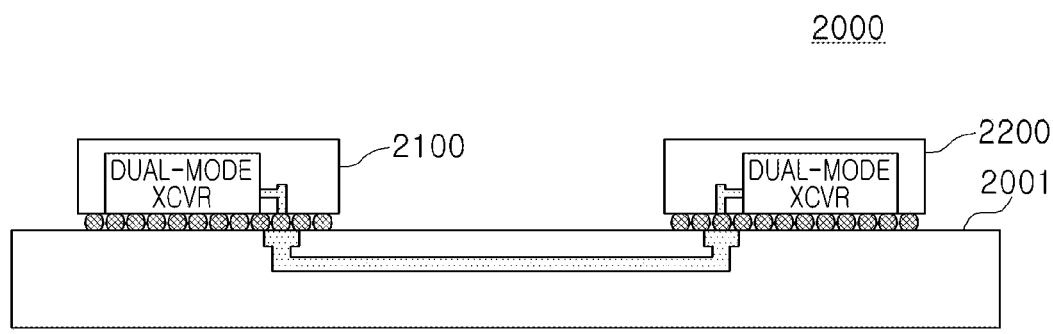
FIG. 14 is a view illustrating a memory system according to example embodiments.

FIG. 14 is a view illustrating a memory system 2000 according to example embodiments. Referring to FIG. 14, the memory system 200 may include a control chip 2100 and/or a memory chip 2200 mounted on a substrate 2001. In example embodiments, the control chip 2100 and the memory chip 2200 may connected to each other through the substrate 2001 provided with an interposer. Each of the control chip 2100 and the memory chip 2200 may include a dual-mode transceiver DUAL-MODE XCVR described in FIGS. 1 to 12B.

A memory device according to example embodiments may be applied to a computing system.

Figure 15:
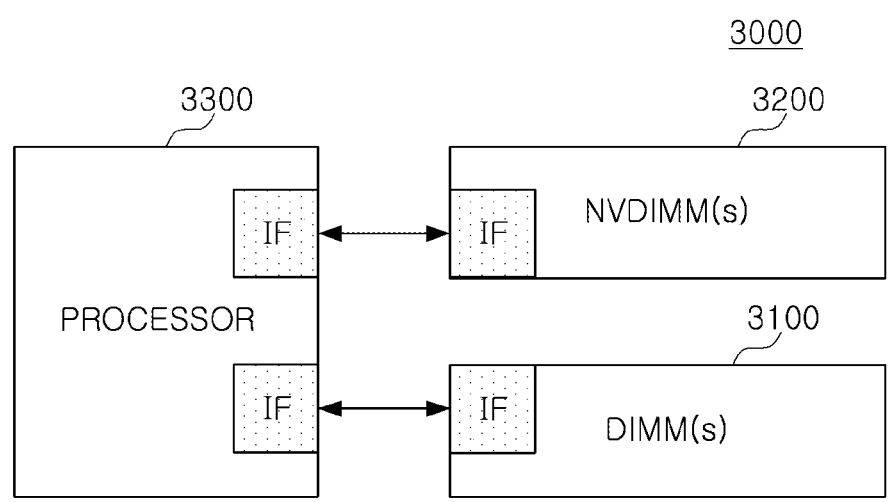
FIG. 15 is a view illustrating a computing system according to example embodiments.

FIG. 15 is a view illustrating a computing system 300 according to example embodiments. Referring to FIG. 15, the computing system 2000 may include at least one volatile memory module (DIMM(s)) 3100, at least one nonvolatile memory module (NVDIMM(s)) 3200, and/or at least one central processing unit (CPU(s)) 3300.

The computing system 3000 may be used as one of a plurality of devices such as a computer, a portable computer, an ultra-mobile personal computer (UMPC), a workstation, a data server, a net-book, a personal data assistant (PDA), a web tablet, a wireless phone, a mobile phone, a smartphone, an e-book, a portable multimedia player (PMP), a digital camera, a digital audio recorder/player, a digital picture/video recorder/player, a portable game machine, a navigation system, a black box, a 3D television, a device capable of transmitting and receiving information at a wireless circumstance, a wearable device, one of various electronics devices constituting a home network, one of various electronics devices constituting a computer network, one of various electronics devices constituting a telematics network, a radio-frequency identification (RFID), one of various electronic devices constituting a computing system, or the like.

The at least one nonvolatile memory module 3200 may include at least one nonvolatile memory. In example embodiments, the at least one nonvolatile memory may include a NAND flash memory, a vertical NAND flash memory (VNAND), a NOR flash memory, a resistive random access memory (RRAM), a phase-change memory (PRAM), a magneto-resistive random access memory (MRAM), a ferroelectric random access memory (FRAM), a spin transfer toque random access memory (STT-RAM), a thyristor random access memory (TRAM), or the like.

In example embodiments, at least one of the memory modules 3100 and 3200 may vary the multilevel transmission signaling mode, described in FIGS. 1 to 12 according to a channel environment, and may include an interface circuit IF performing data communications with the central processing unit 3300 according to the varied transmission signaling mode.

In example embodiments, the memory modules 3100 and 3200 may be connected to the central processing unit 3300 according to a DDRx interface (where x is an integer of 1 or more).

The at least one central processing unit 3300 may be implemented to control the volatile memory module 3100 and the nonvolatile memory module 3200. In example embodiments, the central processing unit 3300 may include a general purpose microprocessor, a multicore processor, a digital signal processor (DSP), an application specific integrated circuit (ASIC), or a combination thereof.

A transmission signaling mode variation according to example embodiments may be performed in a stacked memory package chip.

Figure 16:
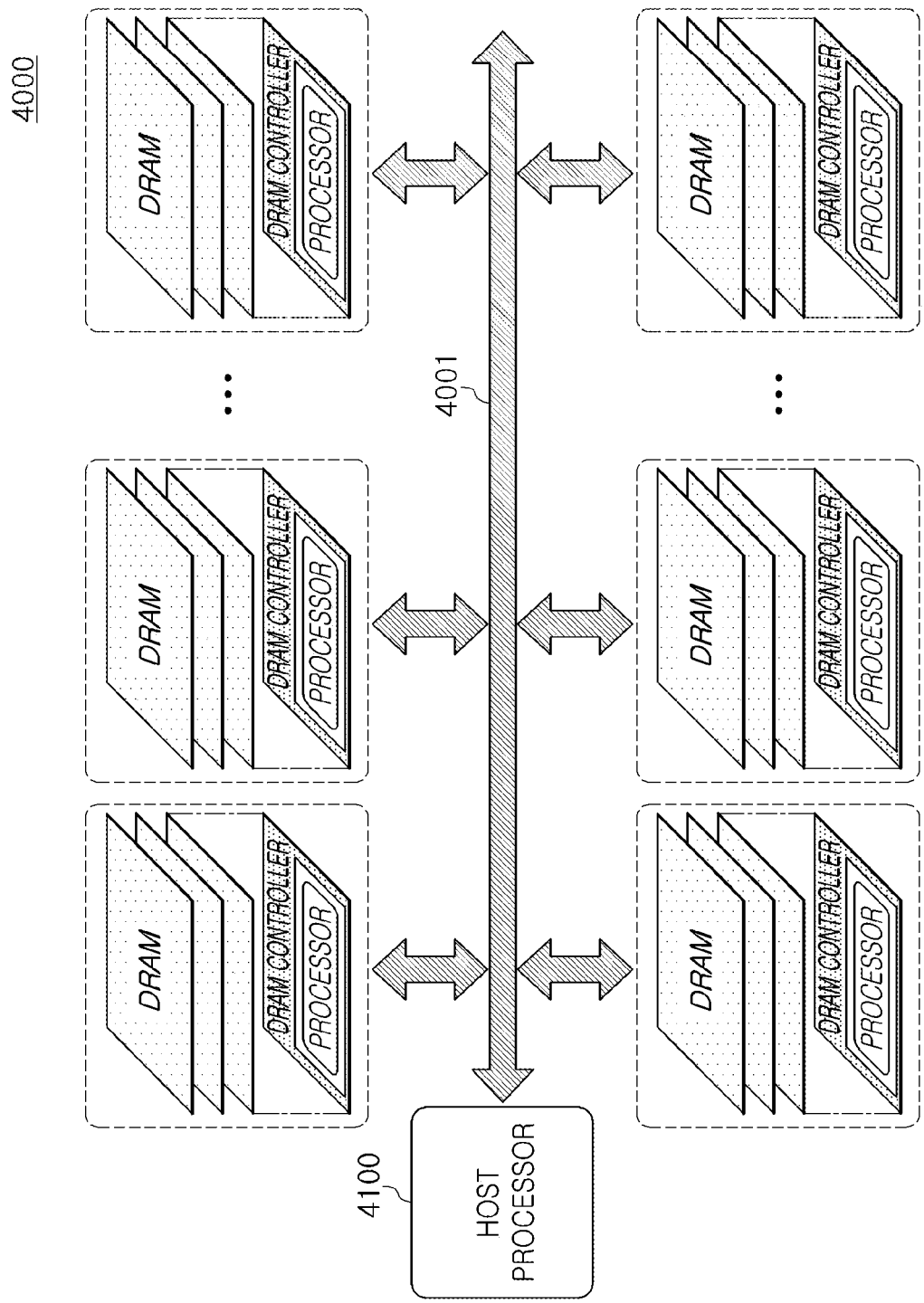
FIG. 16 is a view illustrating a computing system according to example embodiments.

FIG. 16 is a view illustrating a computing system according to example embodiments. Referring to FIG. 16, a computing system 4000 may include a host processor 4100 and/or at least one memory package chip 4210 controlled by the host processor 4100.

In example embodiments, the host processor 4100 and the memory package chip 4210 may transmit and receive data through a channel 4001.

The memory package chip 4210 may include stacked memory chips and a controller chip. As illustrated in FIG. 16, the memory package chip 4210 may include a plurality of DRAM chips disposed on a DRAM controller chip. It will be understood that a configuration of the memory package chip according to the present disclosure is not limited thereto.

In example embodiments, a transmission signaling mode may vary according to an internal channel environment between stacked memory chips and a controller chip of the memory package chip 4210.

In example embodiments, a transmission signaling mode may vary, in real time, according to a channel environment between the host processor 4100 and the memory package chip 4210.

A data communications method according to the present disclosure may be applied to a data center.

Figure 17:
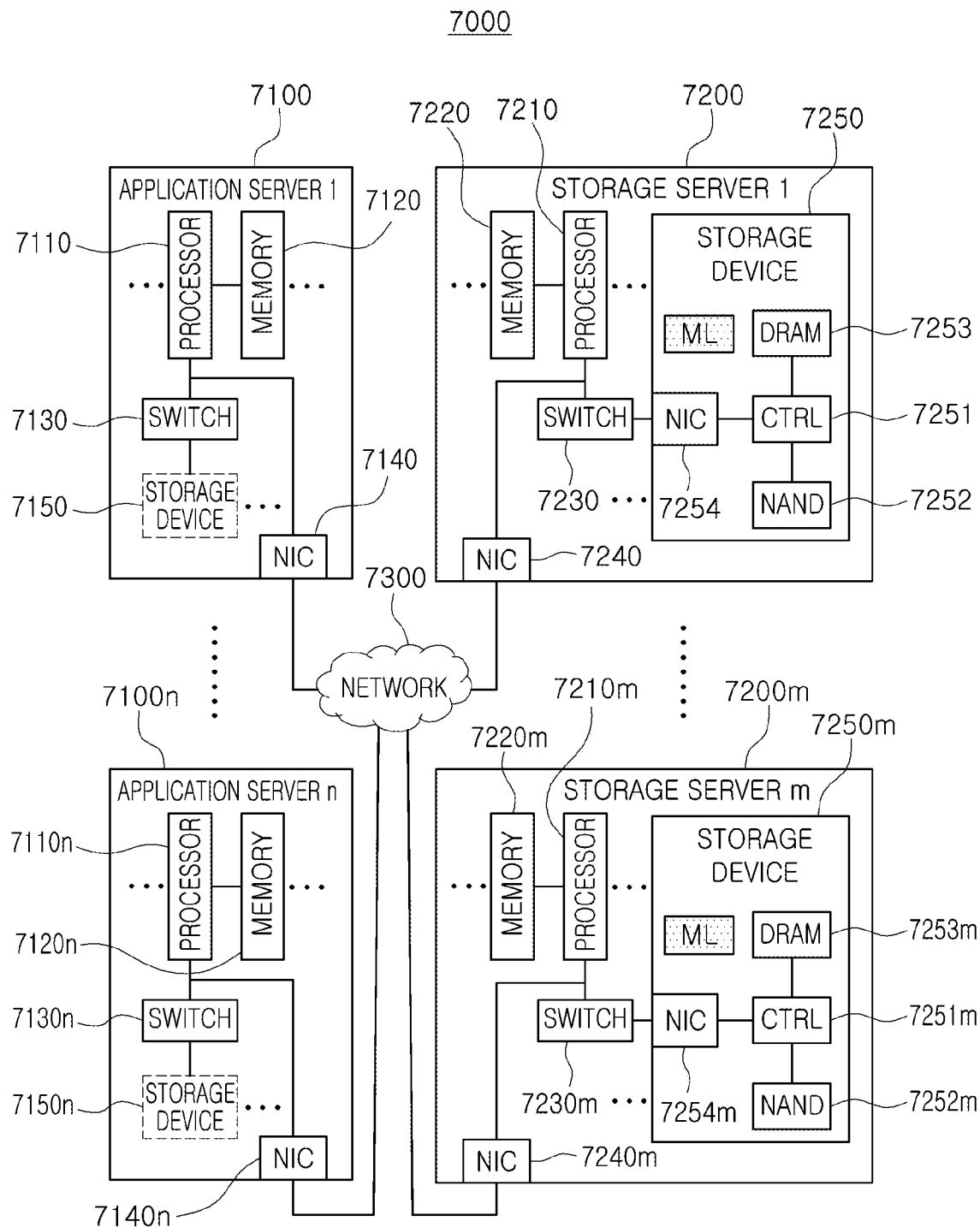
FIG. 17 is a view illustrating a data center to which a memory device according to example embodiments is applied.

FIG. 17 is a view illustrating a data center to which a memory device according to example embodiments is applied. Referring to FIG. 17, a data center 7000 is a facility, collecting various types of data and providing services, and may also be referred to as a data storage center. The data center 7000 may be a system for managing a search engine and database, and may be a computing system used in a company such as a bank or (an organization such as) a government agency. The data center 7000 may include application servers 7100 to 7100$n$ and/or storage servers 7200 to 7200$m$. The number of application servers 7100 to 7100$n$ and the number of storage servers 7200 to 7200$m$ may be variously selected according to example embodiments, and the number of application servers 7100 to 7100$n$ and storage servers 7200 to 7200$m$ may be different from each other.

The application server 7100 or the storage server 7200 may include at least one of the processors 7110 and 7210 and the memories 7120 and 7220. To describe the storage server 7200 as an example, the processor 7210 may control overall operation of the storage server 7200 and may access the memory 7220 to execute a command and/or data loaded in the memory 7220. The memory 7220 may be a double data rate synchronous DRAM (DDR SDRAM), a high bandwidth memory (HBM), a hybrid memory cube (HMC), a dual in-line memory module (DIMM), an optane DIMM, or a non-volatile DIMM (NVMDIMM). According to example embodiments, the number of the processor 7210 included in the storage server 7200 may be variously selected.

In example embodiments, the processor 7210 and the memory 7220 may provide a processor-memory pair. In example embodiments, the number of the processors 7210 and the memories 7220 may be different from each other. The processor 7210 may include a single-core processor or a multiple core processor. The description of the storage server 7200 may be similarly applied to the application server 7100. According to example embodiments, the application server 7100 may not include the storage device 7150. The storage server 7200 may include at least one storage device 7250. The storage device 7259 may be configured to vary a transmission signaling mode according to a channel environment, as described with reference to FIGS. 1 to 16.

The application servers 7100 to 7100n and the storage servers 7200 to 7200m may communicate with each other through a network 7300. The network 7300 may be implemented using a fiber channel (FC), an Ethernet, or the like. The FC may be a medium used for data transmission at relatively high speed and may employ an optical switch for providing higher performance/higher availability. The storage servers 7200 to 7200m may be provided as a file storage, a block storage, or an object storage according to an access method of the network 7300.

In example embodiments, the network 7300 may be a storage area network (SAN). For example, the SAN may be an FC-SAN using an FC network and implemented according to an FC protocol (FCP). As another example, the SAN may be an IP-SAN using a TCP/IP network and implemented according to a SCSI over TCP/IP or Internet SCSI (iSCSI) protocol. In example embodiments, the network 7300 may be a general network such as a TCP/IP network. For example, the network 7300 may be implemented according to a protocol such as an FC over Ethernet (FCoE), a network attached storage (NAS), an NVMe over Fabrics (NVMe-oF), or the like.

Hereinafter, a description will be provided while focusing on the application server 7100 and the storage server 7200. The description of the application server 7100 may be applied to another application server 7100n, and the description of the storage server 7200 may be applied to another storage server 7200m.

The application server 7100 may store data, requested to be stored by a user or a client, in one of the storage servers 7200 to 7200m through the network 7300. In addition, the application server 7100 may obtain data, requested to be read by the user or the client, from one of the storage servers 7200 to 7200m through the network 7300. For example, the application server 7100 may be implemented as a web server, a database management system (DBMS), or the like.

The application server 7100 may access the memory 7120n or the storage device 7150n included in another application server 7100n through the network 7300, or may access the memories 7200 to 7200m or the storage devices or the storage devices 7250 to 7250m included in the memory 7220 to 7220m through the network 7300. Accordingly, the application server 7100 may perform various operations on data stored in the application servers 7100 to 7100n and/or storage servers 7200 to 7200m. For example, the application server 7100 may execute a command to move or copy data between the application servers 7100 to 7100n and/or storage servers 7200 to 7200m. In some example embodiments, the data may be moved from the storage servers 7200 to 7200m to the storage devices 7250 to 7250m to the storage servers 7200 to 7200m through memories 7220 to 7220m, or may be directly moved to the memories 7120 to 7120n of the application servers 7100 to 7100n. Data, moved through the network 7300, may be data encrypted for security or privacy.

To describe the storage server 7200 as an example, the interface 7254 may provide a physical connection between the processor 7210 and a controller 7251 and a physical connection between an NIC 7240 and the controller 7251. For example, the interface 7254 may be implemented by a direct attached storage (DAS) method in which the storage device 7250 is directly connected to an exclusive cable. In addition, for example, the interface 1254 be implemented in various interface manners such as Advanced Technology Attachment (ATA), Serial ATA (SATA), external SATA (e-SATA), Small Computer Small Interface (SCSI), Serial Attached SCSI (SAS), Peripheral PCI Component Interconnection (PCI express), PCIe (NV express), NVMe (NVM express), IEEE 1394, universal serial bus (USB), secure digital (SD) card, multi-media card (MMC), embedded multi-media card (eMMC), Universal Flash Storage (UFS), Embedded Universal Flash Storage (eUFS), Compact Flash (CF) card interface, and the like.

The storage server 7200 may further include a switch 7230 and an NIC 7240. The switch 7230 may selectively connect the processor 7210 and the storage device 7250 to each other or selectively connect the NIC 7240 and the storage device 7250 to each other under the control of the processor 7210.

In example embodiments, the NIC 7240 may include a network interface card, a network adapter, and the like. The NIC 7240 may be connected to the network 7300 by a wired interface, a wireless interface, a Bluetooth interface, an optical interface, or the like. The NIC 7240 may include an internal memory, a DSP, a host bus interface, and the like, and may be connected to the processor 7210 and/or the switch 7230 through a host bus interface. The host bus interface may be implemented as one of the above-described examples of the interface 7254. In example embodiments, the NIC 7240 may be integrated with at least one of the processor 7210, the switch 7230, and the storage 7250.

In the storage servers 7200 to 7200m or the application servers 7100 to 7100n, the processor may transmit data to the storage device 7130 to 7130n and 7250 to 7250m or transmit a command to the memory 7120 to 7120n and 7220 to 7220m to program or read the data. In some example embodiments, the data may be error-corrected data corrected through an error correction code (ECC) engine. The data is data subjected to data bus inversion (DBI) or data masking (DM), and may include cyclic redundancy code (CRC) information. The data may be data encrypted for security or privacy.

The storage device 7150 to 7150m and 7250 to 7250m may transmit a control signal and a command/address signal to the NAND flash memory devices 7252 to 7252m in response to a read command received from the processor. Accordingly, when data is read from the NAND flash memory device 7252 to 7252m, a read enable signal RE may be input as a data output control signal to serve to output data to a DQ bus. A data strobe DQS may be generated using the read enable signal RE. The command and the address signal may be latched in a page buffer according to a rising edge or a falling edge of a write enable signal WE.

The controller 7251 can control overall operation of the storage device 7250. In example embodiments, the controller 7251 may include a static random access memory (SRAM). The controller 7251 may write data to the NAND flash 7252 in response to a write command, or may read data from the NAND flash 7252 in response to a read command. For example, the write command and/or the read command may be provided from the processor 7210 in the storage server 7200, the processor 7210*m* in another storage server 7200*m*, or the processors 7110 and 7110*n* in the application servers 7100 and 7100*n*. The DRAM 7253 may temporarily store (buffer) data to be written to the NAND flash 7252 or data read from the NAND flash 7252. In addition, the DRAM 7253 may store metadata. The metadata is user data or data generated by the controller 7251 to manage the NAND flash memory 7252. The storage device 7250 may include a secure element (SE) for security or privacy.

As described above, example embodiments provide a memory device selecting a transmission signaling mode, a controller controlling the same, a memory system including the same, and a method of operating the same. The memory device may select a transmission signaling mode according to a channel environment and may transmit and receive data according to the selected transmission signaling mode to automatically perform communications under an improved or optimal environment.

In addition, the memory device may detect and select an improved or optimal transmission signaling mode during a training period to operate adaptively to a channel environment.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of the present inventive concepts as defined by the appended claims.

What is claimed is:

1. A memory device comprising:
memory device processing circuitry configured to
transmit read data to a data channel according to a transmission signaling mode;
receive write data from the data channel according to the transmission signaling mode;
store the transmission signaling mode; and
perform a training operation on the data channel in response to a training request received from an external device, to detect at least one mode parameter in the training operation, to select one of a first transmission signaling mode and a second transmission signaling mode as the transmission signaling mode using the detected mode parameter, and to output mode flag information, associated with the detected mode parameter, to the external device.

2. The memory device of claim 1, wherein the first transmission signaling mode is a non-return-to-zero (NRZ) mode, and the second transmission signaling mode is a pulse amplitude modulation 4-level (PAM4) mode.

3. The memory device of claim 1, wherein the at least one parameter comprises at least one of a termination voltage corresponding to the data channel, current consumed by the memory device, and channel loss of the data channel.

4. The memory device of claim 3, wherein the memory device processing circuitry comprises a mode detection circuit which further comprises a termination voltage detector configured to detect the transmission signaling mode by comparing the termination voltage with a reference voltage.

5. The memory device of claim 3, wherein the mode detection circuit comprises a current detector configured to detect the transmission signaling mode by comparing the current, consumed by the memory device, with reference current.

6. The memory device of claim 3, wherein the mode detection circuit comprises a channel loss detector configured to detect the transmission signaling mode by comparing a voltage of the data channel with a predetermined voltage.

7. The memory device of claim 1, wherein the memory device processing circuitry further comprises a transmitter which further comprises:
a serializer configured to convert received parallel data into serial data according to the transmission signaling mode;
a first driver configured to output the converted serial data according to the first transmission signaling mode; and
a second driver configured to output the converted serial data according to the second transmission signaling mode.

8. The memory device of claim 1, wherein the transmission signaling mode is an NRZ mode as a default mode, and the transmission signaling mode is selected from the NRZ mode to the PAM4 mode according to the at least one parameter.

9. The memory device of claim 1, wherein the memory device processing circuitry comprises a mode detection circuit configured to transmit mode selection information, associated with the selected transmission signaling mode, to the external device.

10. The memory device of claim 1, wherein the transmission signaling mode is stored in the memory device processing circuitry a using a mode register set received from the external device.

11. A method of operating a memory device, the method comprising:
receiving a training request for a data channel;
detecting at least one mode parameter according to the training request;
transmitting the detected mode parameter to an external device;
setting at least one of a non-return-to-zero (NRZ) mode and a pulse amplitude modulation 4-level (PAM4) mode to a transmission signaling mode based on mode register set setting information from the external device; and
performing communications with the external device according to the set transmission signaling mode.

12. The method of claim 11, wherein the detecting of the at least one mode parameter comprises:
determining whether a bandwidth corresponding to the data channel is greater than a reference value;
determining whether current consumed by the memory device is higher than reference current; or
determining whether a termination voltage corresponding to the data channel is higher than a reference voltage.

13. The method of claim 12, further comprising:
performing communications in the NRZ mode as a default mode.

14. The method of claim 13, wherein the selecting of the transmission signaling mode comprises selecting the PAM4 mode when the bandwidth is greater than the reference value, when the consumed current is higher than the reference current, or when the termination voltage is higher than the reference voltage.

15. The method of claim 12, further comprising:
performing communications in the PAM4 mode as a default mode,
wherein the selecting of the transmission signaling mode comprises selecting the NRZ mode when the bandwidth is not greater than the reference value, when the consumed current is not higher than the reference current, or when the termination voltage is not higher than the reference voltage.

16. A memory system comprising:
a memory device configured to receive or transmit data through a data channel, according to a transmission signaling mode selected from a first transmission signaling mode and a second transmission signaling mode; and
a controller configured to control the memory device and to select the transmission signaling mode using at least one mode parameter,
wherein the memory device comprises:
memory device processing circuitry comprises configured to
store the transmission signaling mode; and
receive a training request from the controller, to detect at least one mode parameter, associated with the data channel, in response to the training request, and to transmit flag information, associated with the detected at least one mode parameter, to the controller.

17. The memory system of claim 16, wherein the controller comprises:
controller processing circuitry corresponding to the data channel; and
configured to make a training request for the data channel, and
wherein the transmission signaling mode is detected by the memory device processing circuitry according to the training request.

18. The memory system of claim 16, wherein the controller is configured to communicate with the memory device according to the transmission signaling mode stored in the mode register.

19. The memory system of claim 16, wherein one bit of data, corresponding to each of a first voltage level and a second voltage level higher than the first voltage level, is transmitted through the data channel according to the first transmission signaling mode.

20. The memory system of claim 16, wherein two bits of data, corresponding to each of a first voltage level, a second voltage level higher than the first voltage level, a third voltage level higher than the second voltage level, and a fourth voltage level higher than the third voltage level, are transmitted through the data channel according to the second transmission signaling mode.

* * * * *